(12) United States Patent
Jang et al.

(10) Patent No.: US 6,395,573 B1
(45) Date of Patent: May 28, 2002

(54) LASER DIODE AND METHOD FOR FABRICATING THE SAME

(75) Inventors: Jun Ho Jang, Kyungki-do; Kang Hyun Sung, Chungcheongbuk-do, both of (KR)

(73) Assignee: LG Electronics Inc., Seoul (KR)

( * ) Notice: Subject to any disclaimer, the term of this patent is extended or adjusted under 35 U.S.C. 154(b) by 64 days.

(21) Appl. No.: 09/626,800

(22) Filed: Jul. 26, 2000

Related U.S. Application Data

(62) Division of application No. 09/103,576, filed on Jun. 24, 1998, now abandoned.

(30) Foreign Application Priority Data

Aug. 20, 1997 (KR) .............................................. 97-39729

(51) Int. Cl.$^7$ ................................................ H01L 21/00
(52) U.S. Cl. .......................... 438/46; 438/47; 438/93; 438/94; 438/181; 438/22; 438/29; 257/12; 257/14; 257/97; 257/98; 372/43; 372/45; 372/46
(58) Field of Search ............................. 438/46, 47, 93, 438/94, 181, 22, 29; 257/12, 14, 97, 98; 372/45, 46, 43

(56) References Cited

U.S. PATENT DOCUMENTS

| | | | |
|---|---|---|---|
| 4,675,074 A | | 6/1987 | Wada et al. .................. 372/43 |
| 4,758,532 A | * | 7/1988 | Yagi et al. ..................... 438/46 |
| 5,381,024 A | * | 1/1995 | Valster ......................... 257/97 |
| 5,956,359 A | | 9/1999 | Adams et al. ................. 372/45 |

FOREIGN PATENT DOCUMENTS

| | | |
|---|---|---|
| JP | 6-37393 | 2/1994 |
| JP | 6-112590 | 4/1994 |
| JP | 7-86698 | 3/1995 |
| JP | 10-173278 | 6/1998 |

\* cited by examiner

*Primary Examiner*—Matthew Smith
*Assistant Examiner*—Belur V Keshavan
(74) *Attorney, Agent, or Firm*—Fleshner & Kim, LLP

(57) ABSTRACT

Provided with a laser diode and its fabricating method including the steps of: sequentially forming a first conductivity type clad layer, an active layer, a second conductivity type first clad layer, an etch stop layer, a second conductivity type second clad layer, a second conductivity type InGaP layer, and a second conductivity type GaAs layer, on a first conductivity type substrate; forming an insulating layer on the second conductivity type GaAs layer and patterning it, exposing a defined region of the second conductivity type GaAs layer; performing a reactive ion etching using the patterned insulating layer as a mask, etching the second conductivity type GaAs layer, the second conductivity type InGaP layer, and the second conductivity type second clad layer to a specified depth and remaining part of the second conductivity type second clad layer; forming a photoresist on the whole surface including the insulating layer and patterning it, exposing the residual second conductivity type second clad layer; performing a wet etching using the patterned photoresist as a mask to etch the second conductivity type second clad layer, exposing the etch stop layer and etching the residual photoresist and insulating layer; forming a current blocking layer on the exposed etch stop layer, and a second conductivity type contact layer on the whole surface including the current blocking layer; and forming electrodes on the second conductivity type contact layer and beneath the substrate, respectively.

11 Claims, 14 Drawing Sheets

- P-electrode
- P-GaAs contact layer
- P-InGap layer
- current blocking layer
- P-clad layer
- active layer
- N-clad layer
- buffer layer
- substrate
- N-electrode

- P-electrode
- P-GaAs contact layer
- P-InGap layer
- P-second clad
- current blocking layer
- etch stopper layer
- P-first clad layer
- active layer
- N-clad layer
- buffer layer
- substrate
- N-electrode

6,395,573 B1

LASER DIODE AND METHOD FOR FABRICATING THE SAME

This application is a Divisional of application Ser. No. 09/103,576 filed Jun. 24, 1998 now abandoned.

BACKGROUND OF THE INVENTION

1. Field of the Invention

The present invention generally relates to a laser diode with enhanced optical and current characteristics and method for fabricating the same.

2. Discussion of Related Art

The most widely used semiconductor laser diodes in the 635 nm, 650 nm and 670 nm bandwidth of visible ray are typically index wave-guide type laser diodes with an InGaP/AlGaInP heterostructure.

The epitaxial structure for fabrication of such a semiconductor laser diode is prepared on a substrate which is normally misoriented by some degrees (e.g., 9 or 15 degrees) in order to have a shorter wavelength for prevention of a superlattice structure naturally occurring in the crystal growth and for enhancement of optical recording density.

Accordingly, the ridge formed by a wet etching in preparation of device becomes asymmetric due to the effect of the substrate.

This leads to a decrease in the parallel far-field angle out of the characteristics of laser diode and deteriorates the mode stabilization.

Further, the instability of wet etching affects the largescaled productivity and the product yield.

Such a conventional laser diode causing the above problems will be described in more detail with reference to the attached drawings.

FIG. 1 is a cross-sectional view showing an index guided AlGaInP laser structure which is widely used as an SBR (Selectively Buried Ridge) wave-guide laser diode fabricated by a wet etching.

In order to maintain a uniform thickness "t", a laser structure has been developed that has an etch stop layer which is several tens of angstroms in thickness, as shown in FIG. 2.

It is actually necessary to maintain the thickness "t", which is the most important factor that affects the mode characteristics, optical characteristics and current characteristics of laser.

Such an SBR structure as illustrated in FIG. 2 has a great advantage in the simplicity of fabrication process but basically involves a structural problem.

That is, the ridge prepared by a wet etching using an insulating layer as a mask has a great difference between top and bottom ridge widths $W_T$ and $W_B$, and is of an asymmetric shape as seen from the angles a and b due to the substrate characteristic.

The top ridge width $W_T$ relates to the threshold current $I_{th}$ out of the current characteristics, while the bottom ridge width has a close relation with the parallel far-field angle out of the optical characteristics.

To regulate top and bottom ridge widths $W_T$ and $W_B$ with respect to a given size of the insulating layer in the SBR structure, it is necessary to obtain a ridge structure with enhanced both threshold current and parallel far-field angle for the prevention of trade off caused between the threshold current and the parallel far-field angle.

That is, an increase in the bottom ridge width $W_B$ intended to increase the parallel far-field angle reduces the top ridge width $W_T$ below a specified level, which results in a rapid increase in the threshold current, thereby limiting the regulation of bottom ridge width $W_B$.

Inversely, an increase in $W_T$ intended to reduce the threshold current causes $W_B$ to increase, decreasing the parallel far-field angle.

To overcome the problem, many studies have been tried in fabrication of a vertical ridge structure using a reactive ion etching, as illustrated in FIG. 3.

Reactive ion etching is an anisotropic etching technique by which it is easer to regulate an etching depth than by using wet etching, and accordingly, it is more widely used to realize an asymmetric vertical ridge in an epitaxial structure grown on a misoriented wafer.

As shown in FIG. 3, the difference between $W_T$ and $W_B$ is substantially small enough to satisfy the above-mentioned characteristics relative to that caused in the ridge structure obtained by using a wet etching as shown in FIG. 2.

However, an etch stop layer is not used in the method with reactive ion etching, and accordingly, there are some problems that it depends upon the uniformity of the reactive ion etching and the capability to regulate the etching depth, compared to the step in FIG. 2.

Furthermore, a reactive ion etching causes damages on the surface, which becomes troublesome in the growth of n-GaAs current blocking layer.

As described above, a conventional laser diode involves some problems as follows:

A laser diode fabricated by a wet etching has an asymmetric ridge structure, which decreases the parallel far-field angle and deteriorates the stability of mode.

A laser diode fabricated by a reactive ion etching is hard to etch uniformly and to regulate etching depth.

SUMMARY OF THE INVENTION

Accordingly, the present invention is directed to a laser diode and method for fabricating the same that substantially obviates one or more of the problems due to limitations and disadvantages of the related art.

An object of the present invention is to provide a laser diode with enhanced optical and current characteristics and method for fabricating the same by using both wet etching and reactive ion etching techniques.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a laser diode includes: a first conductivity type clad layer formed on a first conductivity type substrate; an active layer formed on the first conductivity type clad layer; a second conductivity type first clad layer formed on the active layer; an etch stop layer formed on the second conductivity type first clad layer; a second conductivity type second clad layer vertically formed on the lateral sides thereof with a specified width in a defined region on the etch stop layer; a second conductivity type InGaP layer formed on the second conductivity type second clad layer and having a width identical to that of the second conductivity type second clad layer; a current blocking layer formed on both lateral sides of the second conductivity type second clad layer; a second conductivity type contact layer formed on the current blocking layer and the second conductivity type InGaP layer; and electrodes formed beneath the substrate and on the second conductivity type contact layer, respectively.

In another aspect of the present invention, a method of fabricating a laser diode includes the steps of: sequentially forming a first conductivity type clad layer, an active layer, a second conductivity type first clad layer, an etch stop layer, a second conductivity type second clad layer, a second conductivity type InGaP layer, and a second conductivity type GaAs layer, on a first conductivity type substrate; forming an insulating layer on the second conductivity type GaAs layer and patterning it, exposing a defined region of the second conductivity type GaAs layer; performing a reactive ion etching using the patterned insulating layer as a mask, etching the second conductivity type GaAs layer, the second conductivity type InGaP layer, and the second conductivity type second clad layer to a specified depth and remaining part of the second conductivity type second clad layer; forming a photoresist on the whole surface including the insulating layer and patterning it, exposing the residual second conductivity type second clad layer; performing a wet etching using the patterned photoresist as a mask to etch the second conductivity type second clad layer, exposing the etch stop layer and etching the residual photoresist and insulating layer; forming a current blocking layer on the exposed etch stop layer, and a second conductivity type contact layer on the whole surface including the current blocking layer; and forming electrodes on the second conductivity type contact layer and beneath the substrate, respectively.

In further another aspect of the present invention, a method of fabricating a laser diode includes the steps of: sequentially forming a first conductivity type clad layer, an active layer, a second conductivity type first clad layer, an etch stop layer, a second conductivity type second clad layer, a second conductivity type InGaP layer, and a second conductivity type GaAs layer, on a first conductivity type substrate; forming a first insulating layer on the second conductivity type GaAs layer and patterning it, exposing a defined region of the second conductivity type GaAs layer; performing a reactive ion etching using the patterned first insulating layer as a mask, etching the second conductivity type GaAs layer, the second conductivity type InGaP layer, and the second conductivity type second clad layer to a specified depth and remaining part of the second conductivity type second clad layer; sequentially forming a second insulating layer and a photoresist on the whole surface including the first insulating layer, and patterning the photoresist, exposing the second insulating layer on the residual second conductivity type second clad layer; performing a wet etching using the patterned photoresist as a mask to etch the second insulating layer and the second conductivity type second clad layer, exposing the etch stop layer and etching the residual photoresist and first and second insulating layers; forming a current blocking layer on the exposed etch stop layer, and a second conductivity type contact layer on the whole surface including the current blocking layer; and forming electrodes on the second conductivity type contact layer and beneath the substrate, respectively.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Preferred Embodiment 1:

FIGS. 4A–4I are cross-sectional views illustrating process steps for fabricating a laser diode in accordance with a first preferred embodiment of the present invention.

Figure 1:
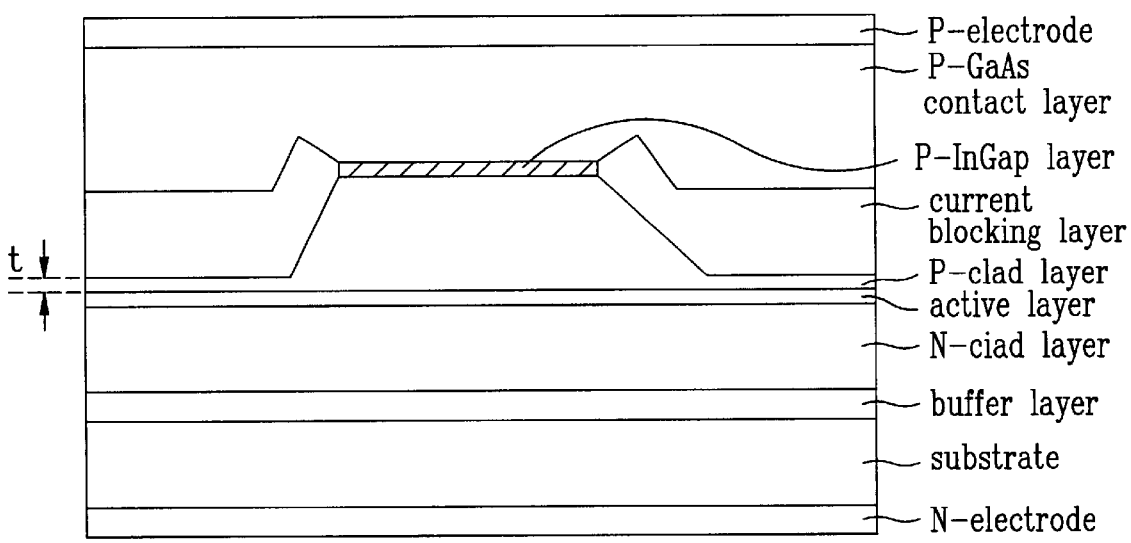
FIGS. 1–3 are cross-sectional views showing a laser diode according to prior art.
Figure 2:
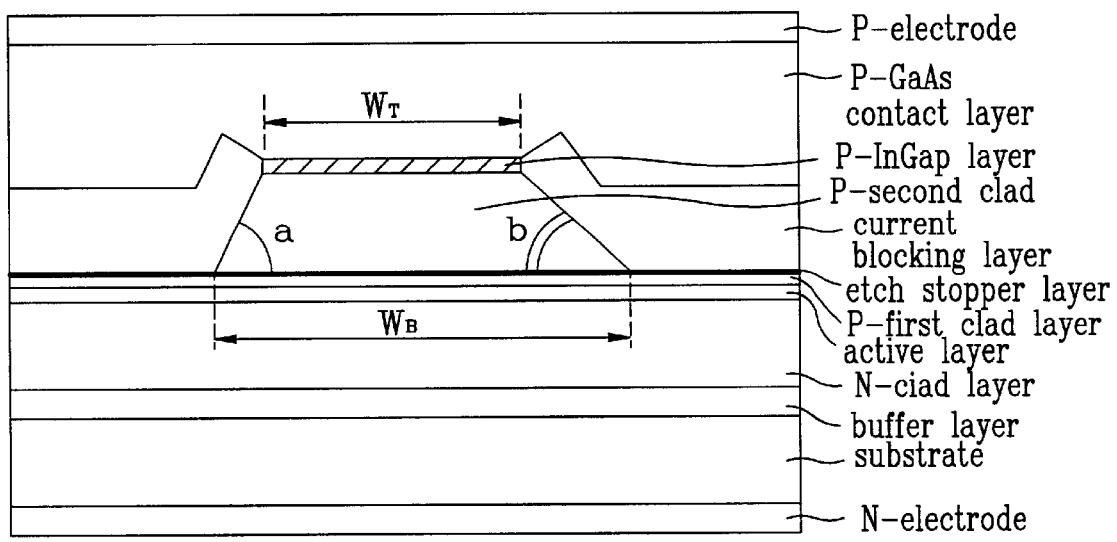
Figure 3:
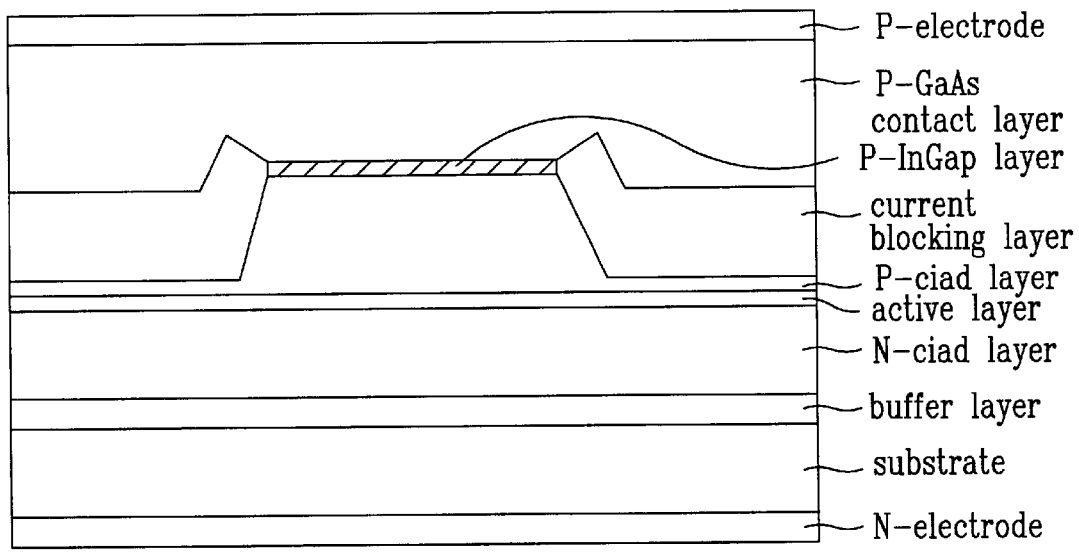
Figure 4A:
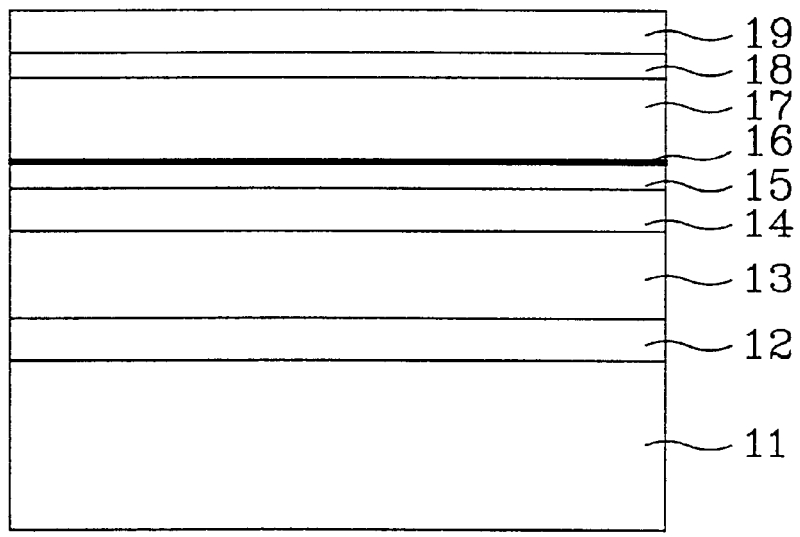
FIGS. 4A–4I are cross-sectional views illustrating process steps for fabricating a laser diode in accordance with a first preferred embodiment of the present invention.

As shown in FIG. 4A, on an n-type GaAs substrate 11 are sequentially grown n-type GaAs buffer layer 12, n-type AlGaInP clad layer 13, active layer 14, p-type primary AlGaInP clad layer 15, p-type InGaP etching-stopper layer 16, p-type secondary AlGaInP clad layer 17, p-type InGaP layer 18, and p-type GaAs layer 19.

Figure 4B:
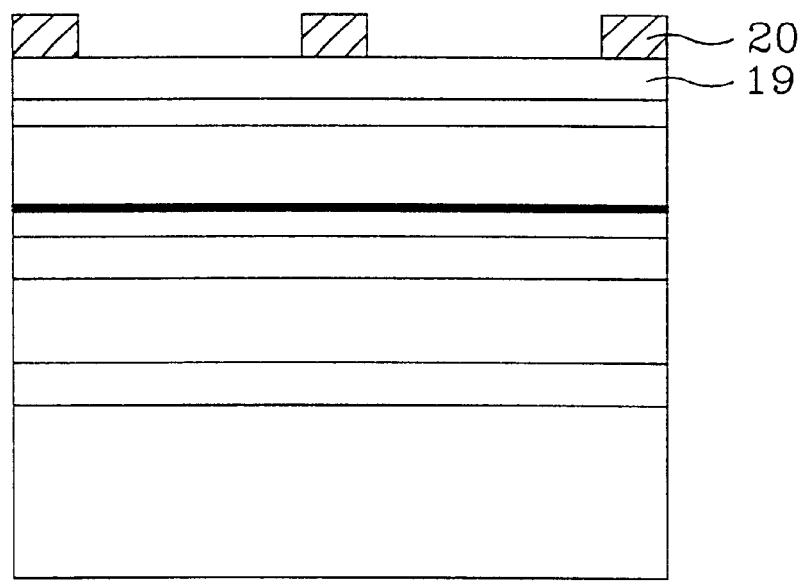

Subsequently, as shown in FIG. 4B, a first insulating layer is formed on the p-type GaAs layer 19 and patterned, exposing a defined region of the p-type GaAs layer 19, in order to produce a desired ridge structure such as stripe type ridge, tapered type ridge or the like.

The first insulating layer 20 in this case is made of $SiO_2$ or $SiN_x$.

Figure 4C:
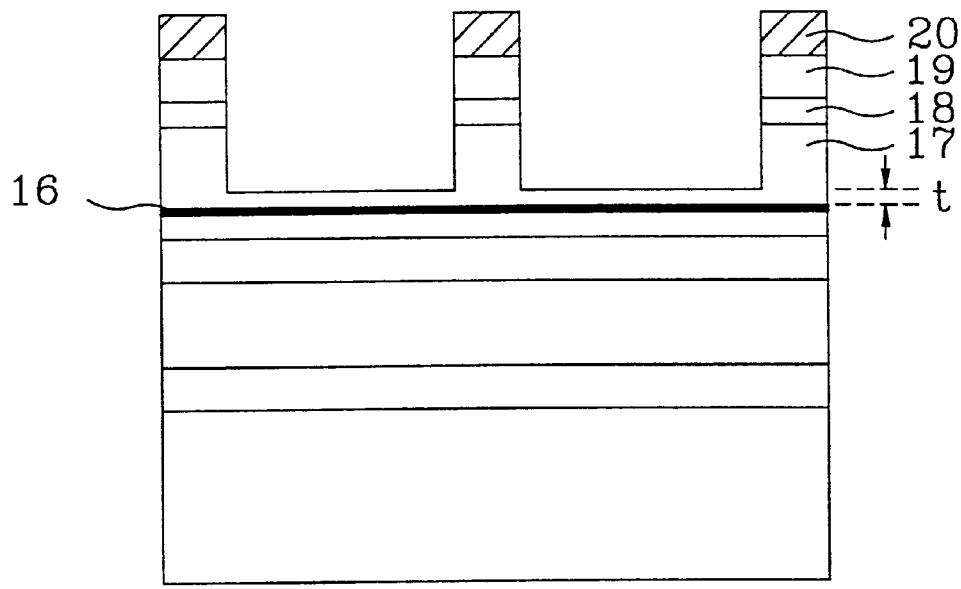

As shown in FIG. 4C, a reactive ion etching is performed using the patterned first insulating layer 20 as a mask, etching part of the exposed p-type GaAs layer 19, p-type InGaP layer 18, and p-type secondary AlGaInP clad layer 17.

It is preferable to control an etching of the p-type secondary AlGaInP clad layer 17 overlying the p-type InGaP etch stop layer 16 and remain the p-type secondary AlGaInP clad layer 17 as thick as a thickness "t" in the range between about 1000 to 2000 Å.

This affects the elimination of damage on the surface resulting from the reactive ion etching, and the subsequent wet etching step.

Figure 4D:
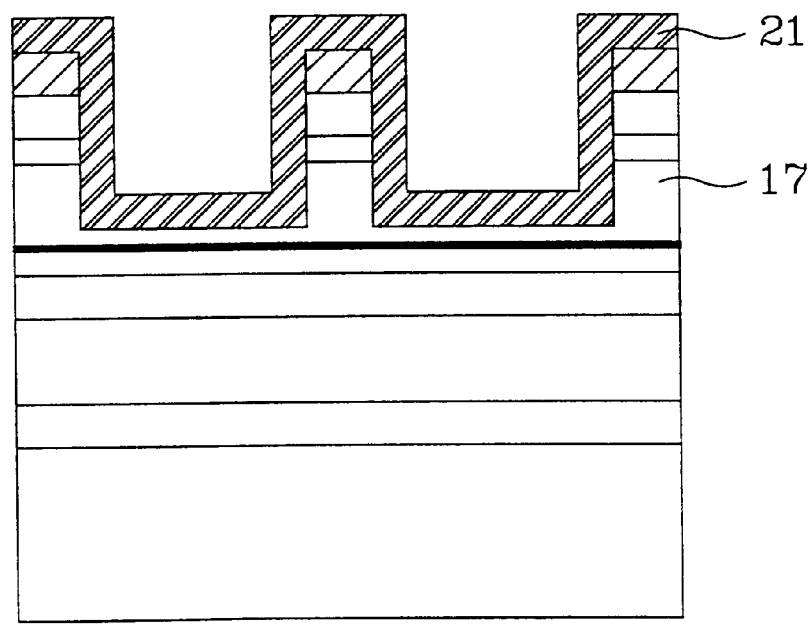
Figure 4E:
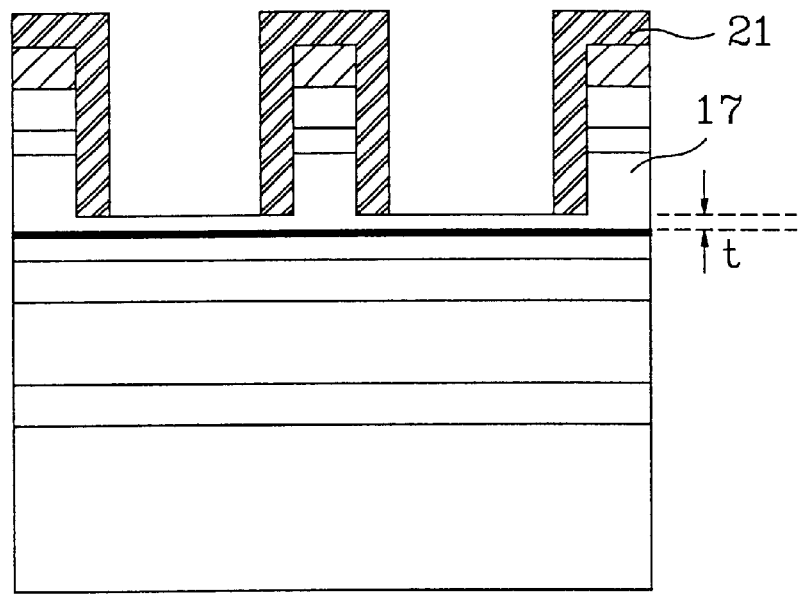

As shown in FIG. 4D, a first photoresist 21 is formed on the whole surface including the p-type secondary AlGaInP clad layer 17, and the first photoresist 21 is patterned, exposing the p-type secondary AlGaInP clad layer 17 remaining as thick as the thickness "t", as shown in FIG. 4E.

Figure 4F:
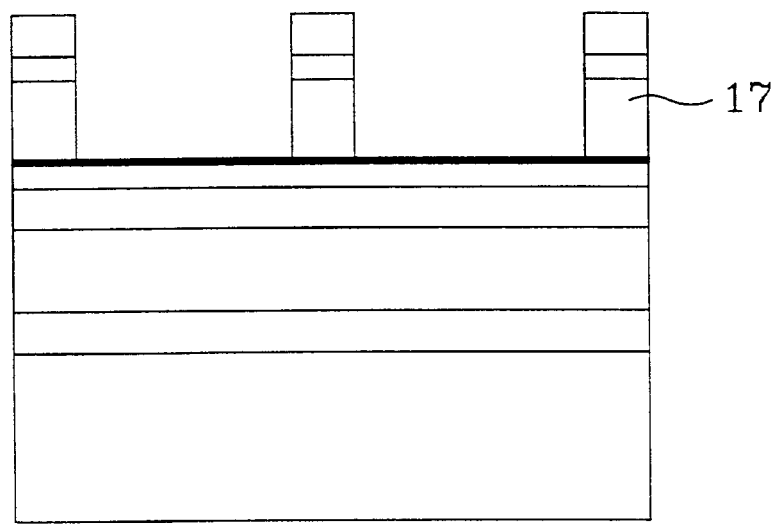

Next, as shown in FIG. 4F, a wet etching is performed using the first photoresist 21 as a mask so as to etch the p-type secondary AlGaInP clad layer 17 remaining as thick as the thickness "t", the first photoresist 21, and the first insulating layer 20, sequentially.

After the completion of etching step, the entire ridge structure has an almost vertical shape.

This step is most important in the present invention and will be described in further detail later.

Figure 4G:
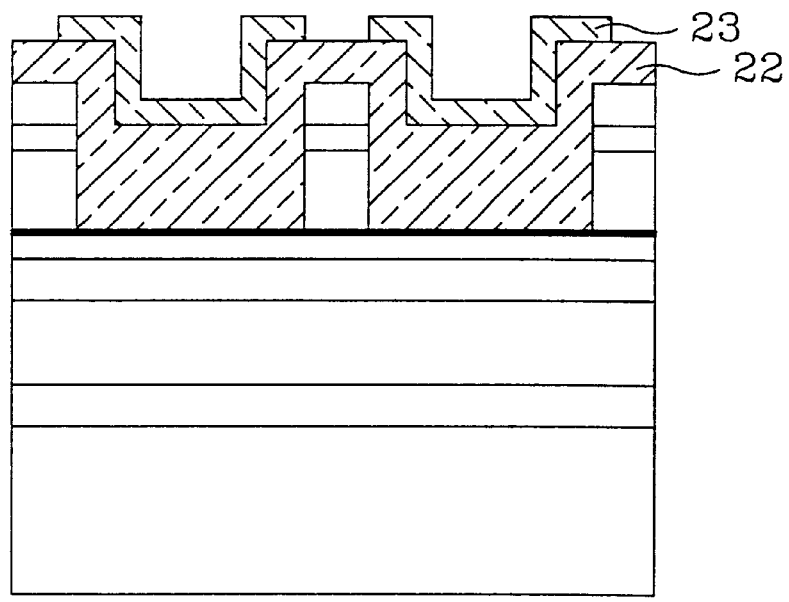

As shown in FIG. 4G, there are sequentially formed an n-type GaAs current blocking layer 22 on the whole surface including the ridge structure, and a second photoresist 23 overlying the n-type GaAs current blocking layer 22.

The second photoresist 23 is patterned to expose the n-type GaAs current blocking layer 22 on the ridge structure.

Figure 4H:
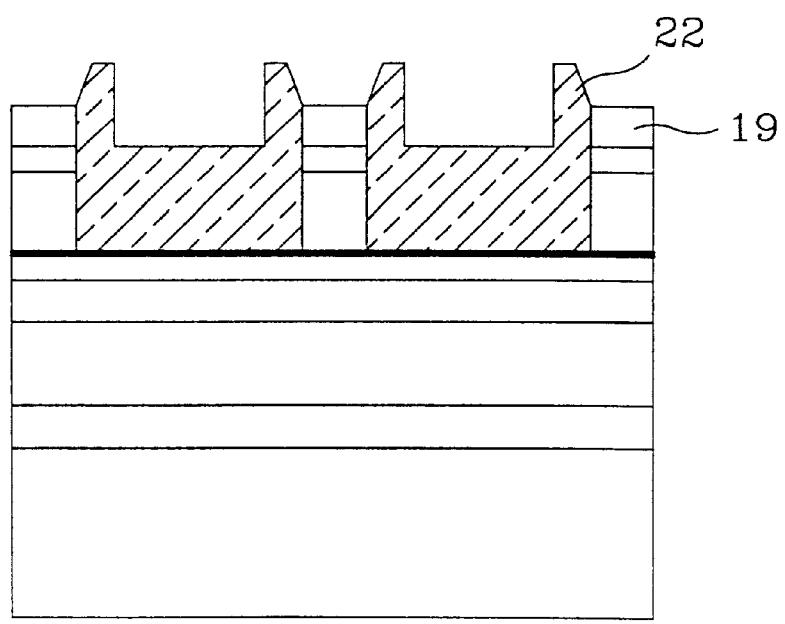

As shown in FIG. 4H, the n-type GaAs current blocking layer 22 is subjected to a wet etching, exposing the p-type GaAs layer 19 and etching the residual second photoresist 23.

Figure 4I:
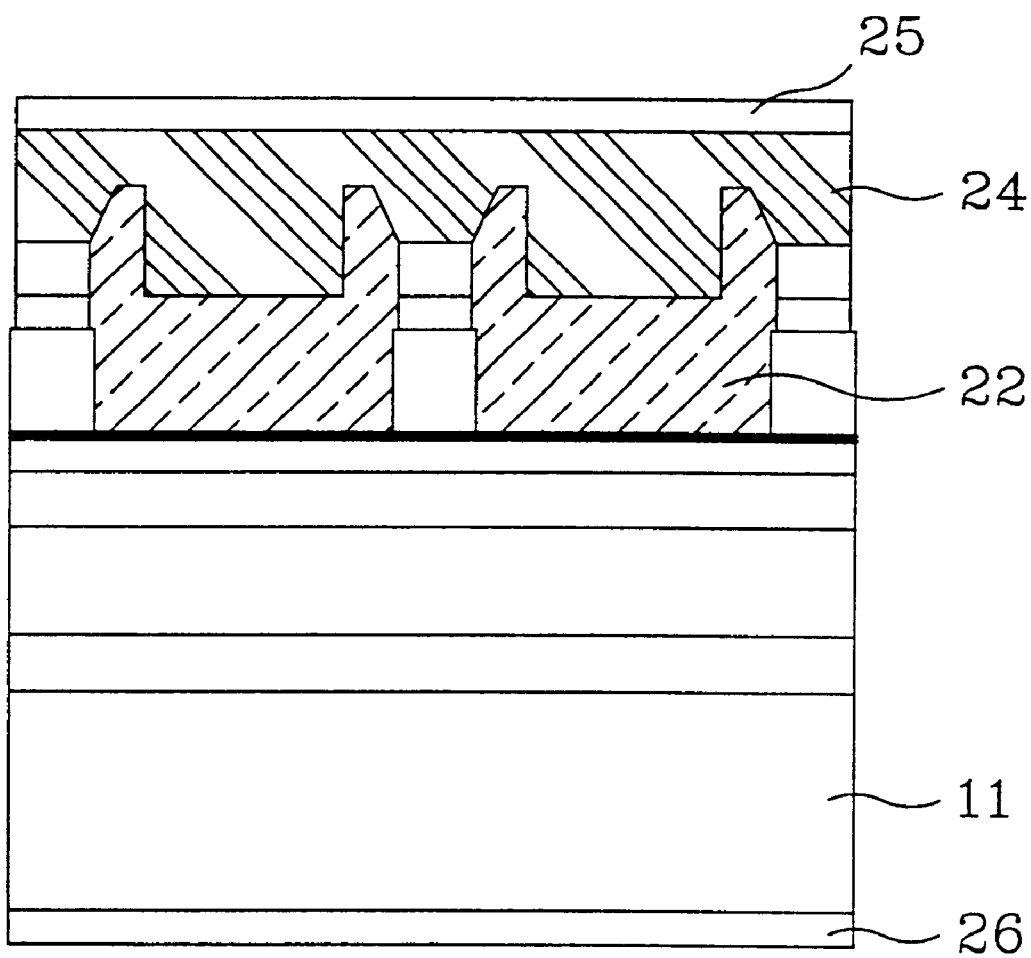

Subsequently, as shown in FIG. 4I, a p-type GaAs contact layer 24 is formed on the whole surface including the n-type GaAs, current blocking layer 22.

P-type electrode 25 is then formed on the p-type GaAs contact layer 24, while an n-type electrode 26 is formed beneath the n-type GaAs substrate 11, completing a laser diode.

Figure 5A:
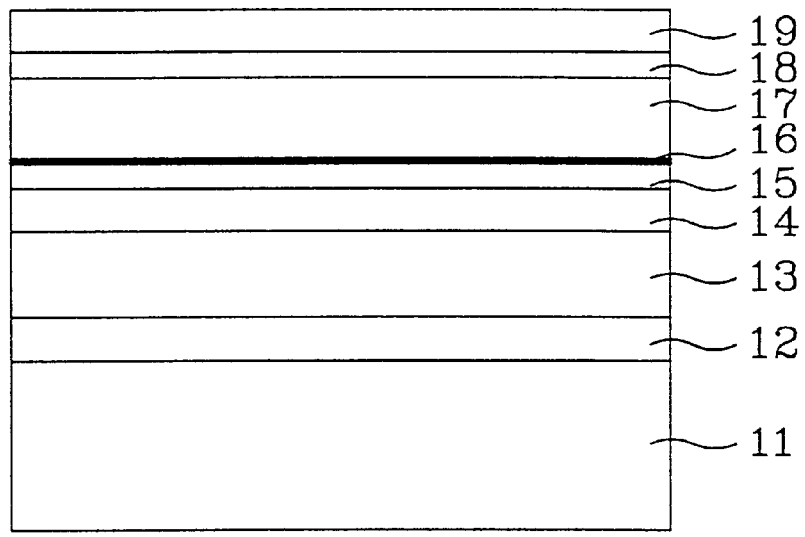
FIGS. 5A–5I are cross-sectional views illustrating process steps for fabricating a laser diode in-accordance with a second is preferred embodiment of the present invention.
Figure 5B:
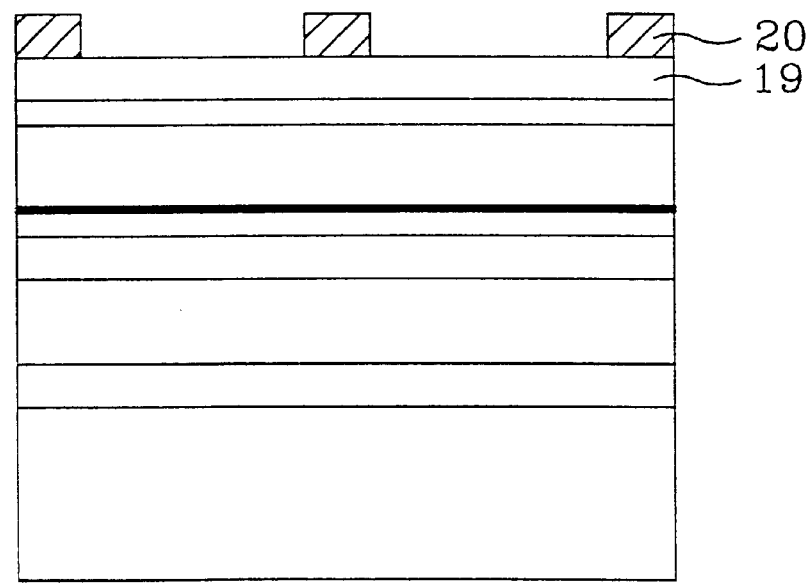
Figure 5C:
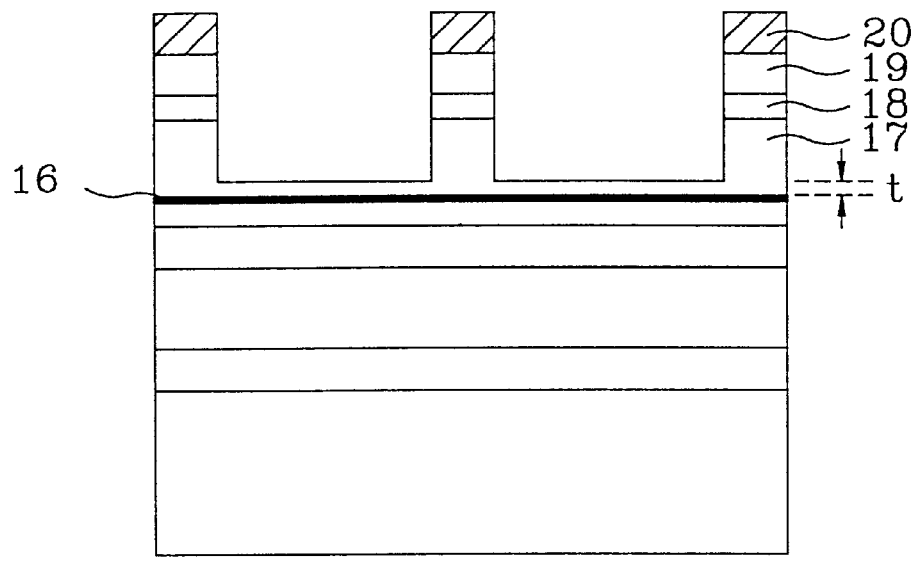

Preferred Embodiment 2:

FIGS. 5A–5I are cross-sectional views illustrating process steps for fabricating a laser diode in accordance with a second preferred embodiment of the present invention. FIGS. 5A–5C are analogous to FIGS. 4A–4C and detailed description will be omitted.

Figure 5D:
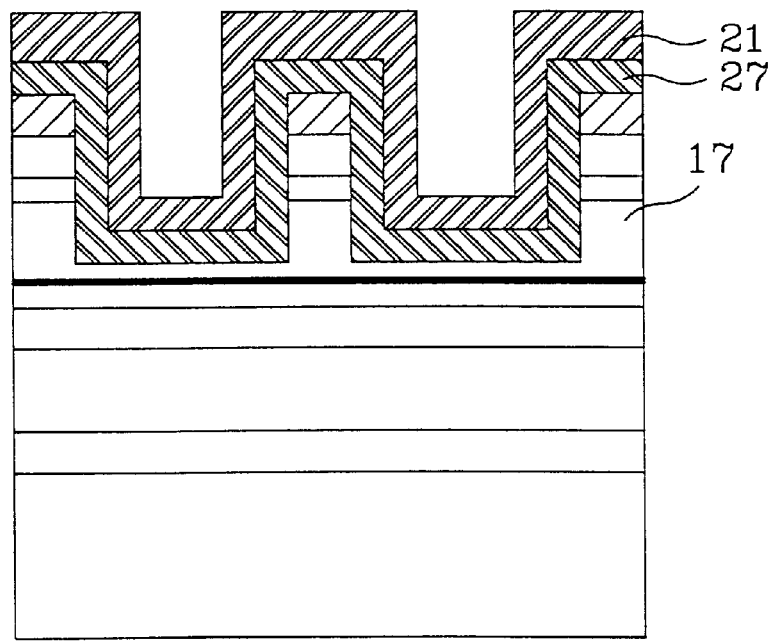

As shown in FIG. 5D, there are sequentially formed a second insulating layer 27 and a first photoresist 21 on the whole surface including the p-type secondary AlGaInP clad layer 17.

Unlike the first preferred embodiment, the second insulating layer 27 is further formed in order to prevent the first photoresist 21 used as a mask from being affected by $H_2SO_4$ solution which is normally used as an etching solution in etching the p-type secondary AlGaInP clad layer 17 remaining as thick as the thickness "t".

Figure 5E:
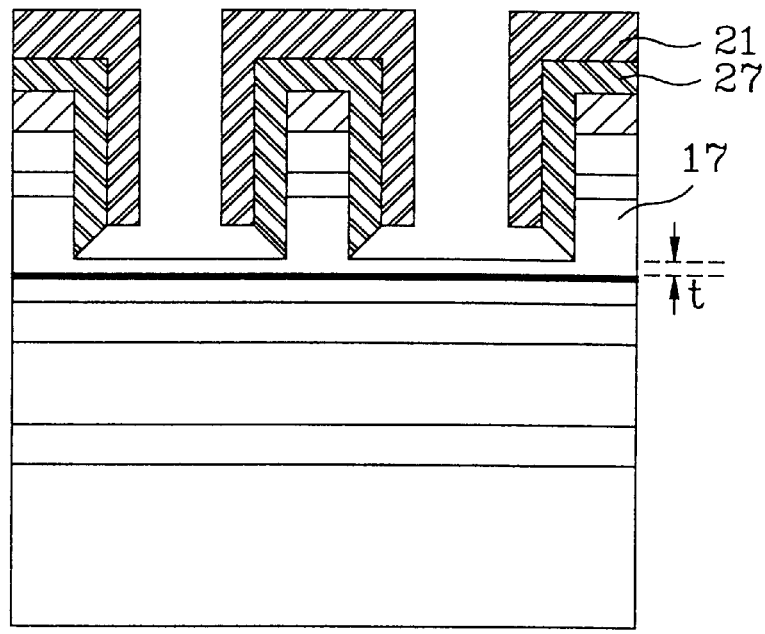

Subsequently, as shown in FIG. 5E, the first photoresist 21 is patterned to expose the second insulating layer 27 overlying the p-type secondary AlGaInP clad layer 17 remaining as thick as the thickness "t". The second insulating layer 27 is then etched using the first photoresist 21 as a mask in order to obtain an insulating layer mask which will be used in the subsequent wet etching step.

Figure 5F:
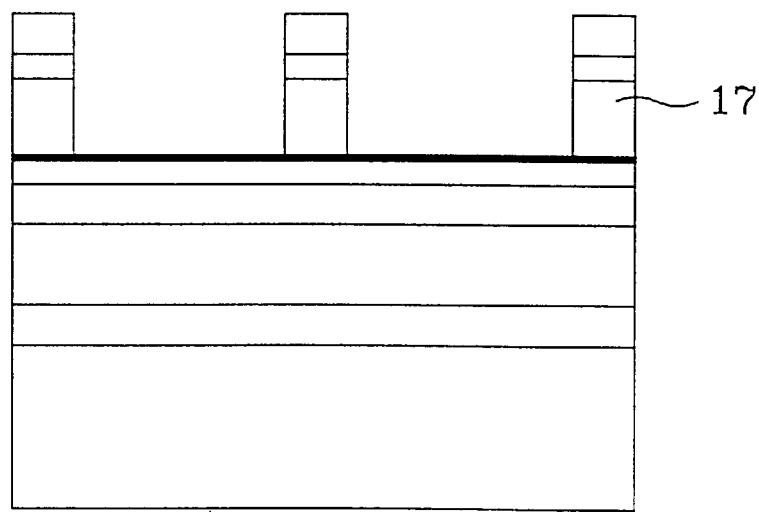

As shown in FIG. 5F, a wet etching is performed using the second insulating layer 27 as a mask, etching the p-type secondary AlGaInP clad layer 17 remaining as thick as the thickness "t", the first photoresist 21, and the first and second insulating layers 20 and 27, sequentially. Thus completed ridge structure has an almost vertical shape.

This step is of great importance as in the first preferred embodiment and will be described in further detail later.

Figure 5G:
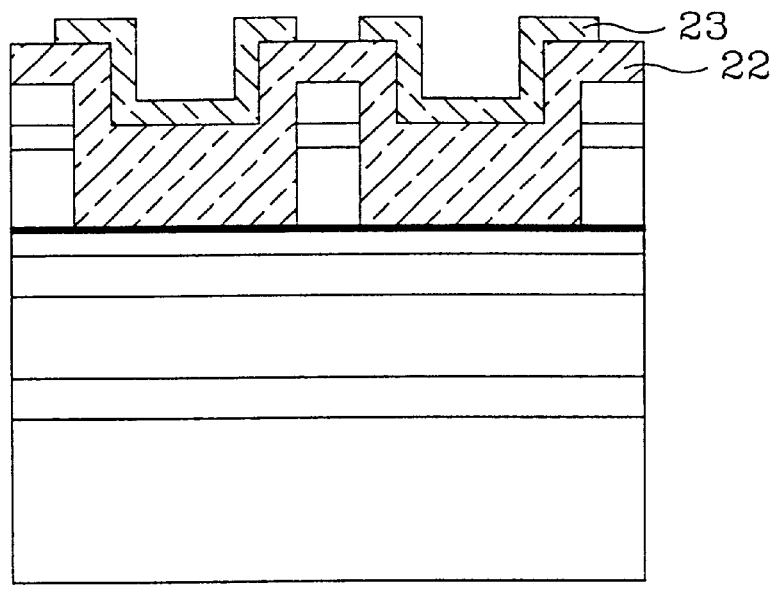
Figure 5H:
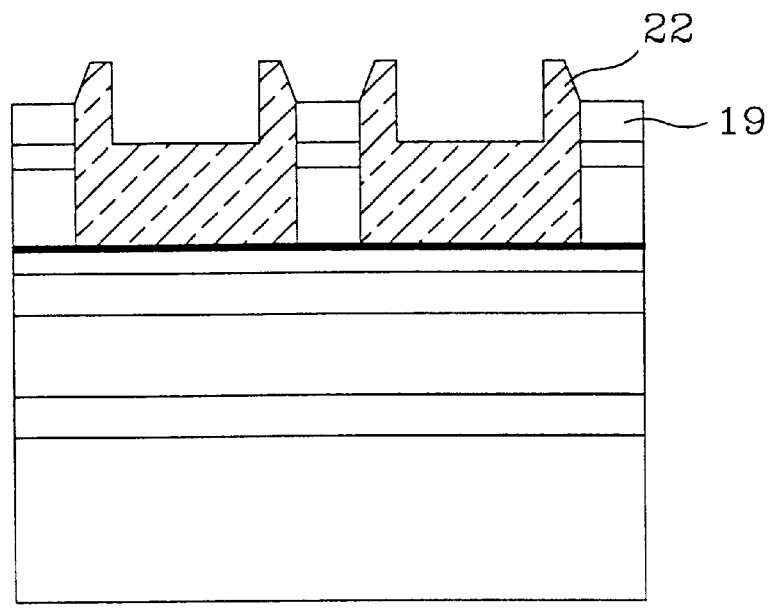
Figure 5I:
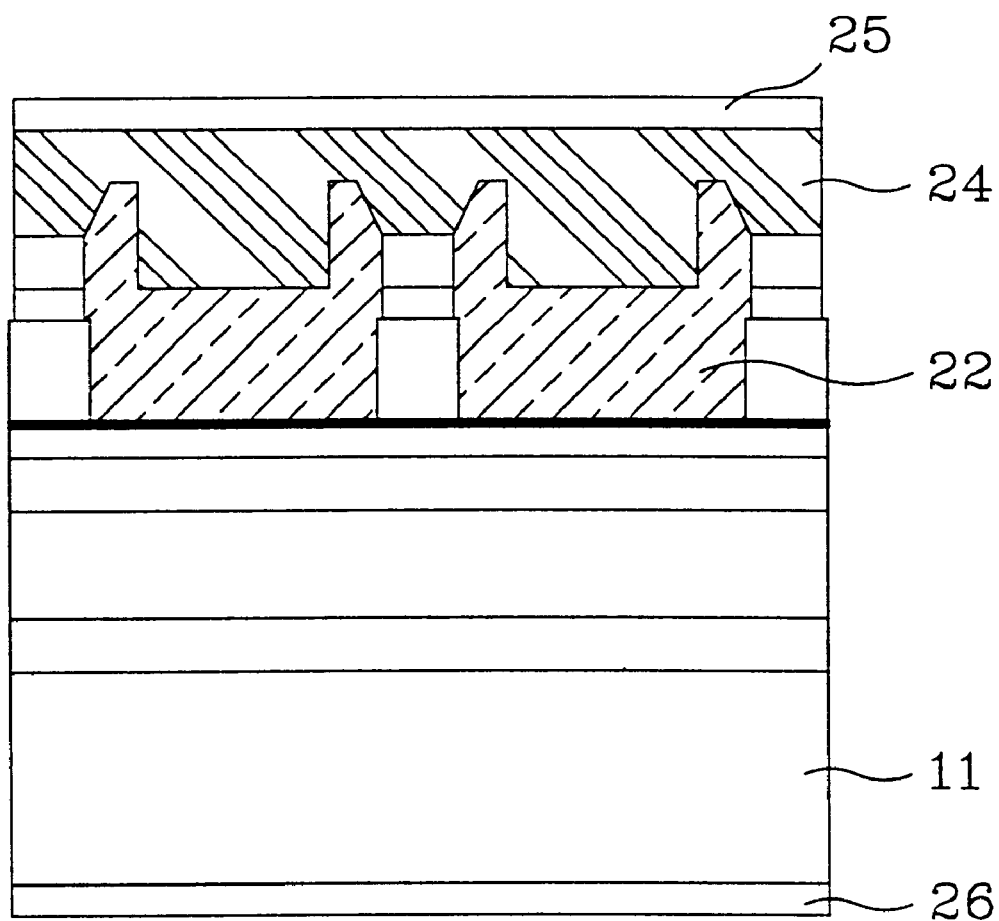

FIGS. 5G–5I are analogous to FIGS. 4G–4I and detailed description will be omitted.

As described above, the most significant part in fabrication of a laser diode with a vertical ridge structure is a wet etching step to etch the p-type secondary AlGaInP clad layer remaining as thick as the thickness "t" as illustrated in FIG. 4E in the first embodiment and FIG. 5E in the second embodiment.

Figure 6:
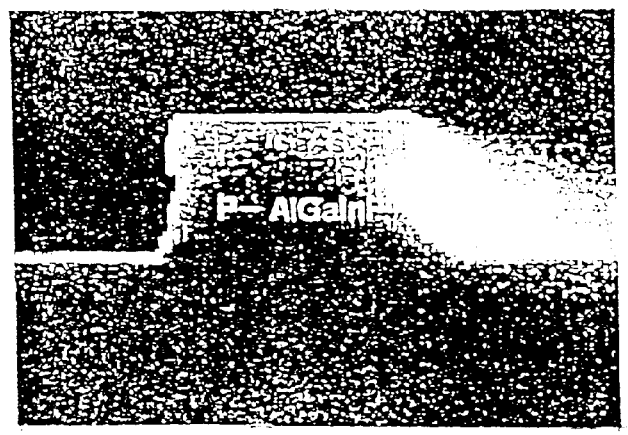
FIG. 6 is a photograph showing the final ridge subjected to a wet etching right after a reactive etching.

The reason the steps in FIGS. 4E and 5E are of such a great significance in the present invention will be more apparent with reference to FIG. 6.

FIG. 6 is a photograph showing the final ridge structure which is obtained by a wet etching performed right after a reactive etching step. In case a wet etching is performed after the reactive etching step skipping the steps illustrated in FIG. 4E in the first embodiment or FIG. 5E in the second embodiment, side b is less sloped relative to side a which is almost vertically etched, due to the substrate characteristics, as shown in FIG. 6.

Therefore, the present invention includes the steps illustrated in FIG. 4E or 5E in order to overcome the problem that side b is not sloped sufficient to make a ridge structure have a vertical shape due to substrate and material characteristics during a wet etching performed over the p-type secondary AlGaInP clad layer remaining as thick as the thickness "t".

Figure 7:
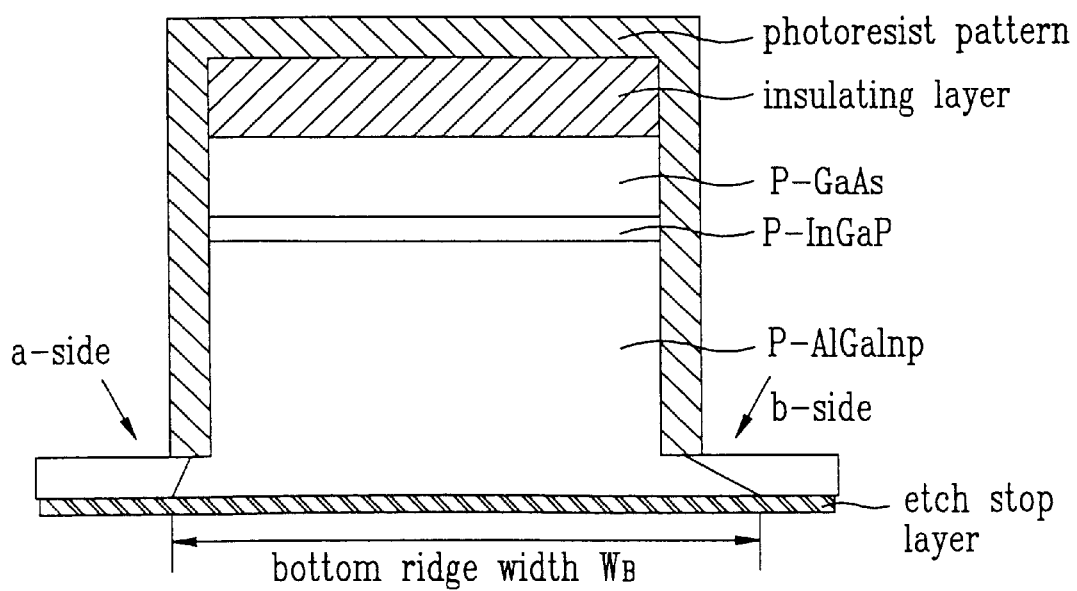
FIG. 7 is a detailed view of FIG. 4E.

FIG. 7 is a detailed view of FIG. 4E in the first preferred embodiment of the present invention, wherein the final ridge structure has a perfect vertical form and its lower part is sloped to a certain extent on both lateral sides.

This results from the effect of an etching solution used in patterning the photoresist but is much insignificant compared to the conventional ridge structure.

Furthermore, the present invention has an advantage in that the process is performed with ease because there is no need to align a photoresist: accurately in the center of the ridge structure.

Figure 8:
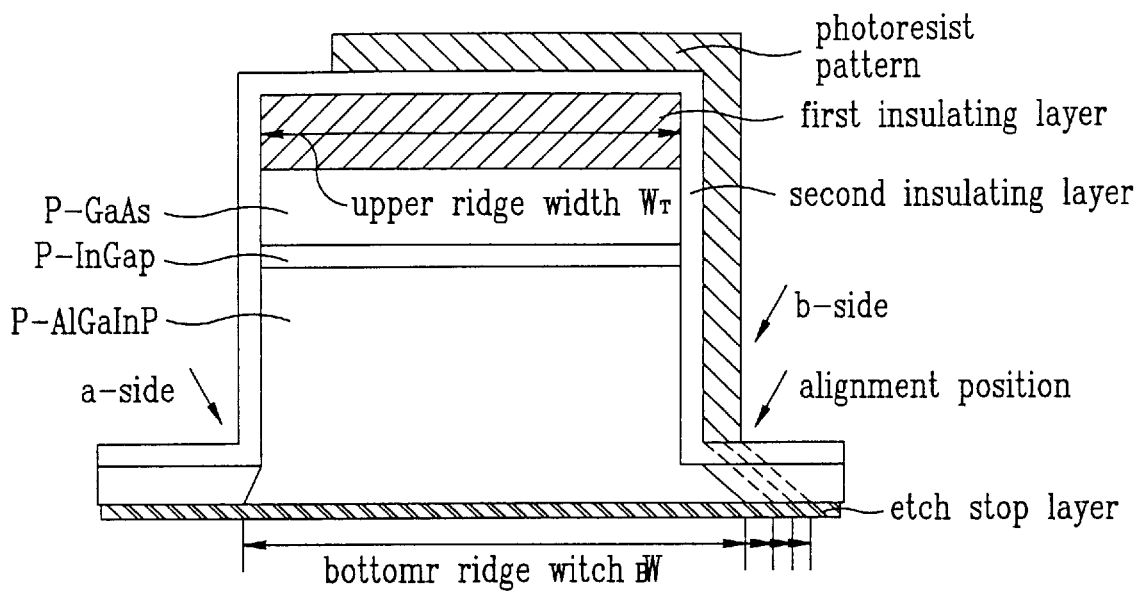
FIG. 8 is a detailed view of FIG. 5E.

On the other hand, FIG. 8 is a detailed view of FIG. 5E in the second preferred embodiment of the present invention, wherein an etching is controlled in preparing a mask from the second insulating layer after patterning the photoresist such that the alignment position of the second insulating layer can be regulated to reduce the bottom ridge width $W_B$ to the minimum.

Compared to the step in FIG. 4E in the first preferred embodiment, the step in FIG. 5E in the second preferred embodiment is considered to be more efficient in fabrication of a laser diode since the bottom ridge width can be minimized despite a requirement of an additional step for depositing the second insulating layer.

Figure 9:
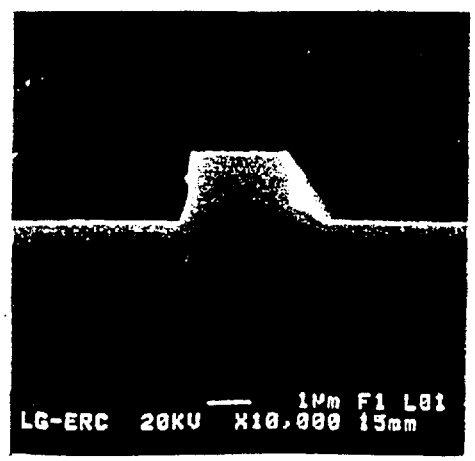
FIG. 9 is a photograph showing the ridge structure of a laser diode in accordance with the present invention.

FIG. 9 is a photograph showing the ridge structure of the laser diode fabricated in the present invention, wherein side b is much different from that in FIG. 6.

That is, a laser diode fabricated in the process steps of the present invention has an optimized ridge structure with improved optical and current characteristics resulting from the difference between top and bottom ridge widths.

Such as in the present invention as described above, the laser diode and its fabricating method has some advantages as follows.

A use of both reactive ion etching and wet etching techniques overcomes the problem with optimization of the ridge structure that is caused by the individual steps, either reactive ion etching or wet etching.

That is, lower oscillating start current and large parallel far-field angle can be secured with efficiency in use by improving the optical and current characteristics resulting from the difference between top and bottom ridge widths.

Additionally, uniformity and reproductivity are more effectively realized relative to the process using only wet etching step, thereby increasing the production yields.

It will be apparent to those skilled in the art that various modifications and variations can be made in the laser diode and method for fabricating the same according to the present invention without departing from the spirit or scope of the invention. Thus, it is intended that the present invention cover the modifications and variations of this invention provided they come within the scope of the appended claims and their equivalents.

What is claimed is:

1. A method for fabricating a laser diode comprising the steps of:
   sequentially forming a first conductivity type clad layer, an active layer, a second conductivity type first clad layer, an etch stop layer, a second conductivity type second clad layer, a second conductivity type InGaP layer, and a second conductivity type GaAs layer, on a first conductivity type substrate;
   forming an insulating layer on the second conductivity type GaAs layer and patterning it, exposing a defined region of the second conductivity type GaAs layer;
   performing a reactive ion etching using the patterned insulating layer as a mask, etching the second conductivity type GaAs layer, the second conductivity type InGaP layer, and the second conductivity type second clad layer to a specified depth and remaining part of the second conductivity type second clad layer;
   forming a photoresist on the whole surface including the insulating layer and patterning it, exposing the residual second conductivity type second clad layer;
   performing a wet etching using the patterned photoresist as a mask to etch the second conductivity type second clad layer, exposing the etch stop layer and etching the residual photoresist and insulating layer;
   forming a current blocking layer on the exposed etch stop layer, and a second conductivity type contact layer on the whole surface including the current blocking layer; and
   forming electrodes on the second conductivity type contact layer and beneath the substrate, respectively.

2. The method as defined in claim 1, wherein the insulating layer is; made of $SiO_2$ or $SiN_x$.

3. The method as defined in claim 1, wherein the second conductivity type second clad layer remains in the 1000 to 2000 Å range of thickness during the reactive ion etching step.

4. A method for fabricating a laser diode comprising the steps of:
   sequentially forming a first conductivity type clad layer, an active layer, a second conductivity type first clad layer, an etch stop layer, a second conductivity type second clad layer, a second conductivity type InGaP layer, and a second conductivity type GaAs layer, on a first conductivity type substrate;
   forming a first insulating layer on the second conductivity type GaAs layer and patterning it, exposing a defined region of the second conductivity type GaAs layer;
   performing a reactive ion etching using the patterned first insulating layer as a mask, etching the second conductivity type GaAs layer, the second conductivity type InGaP layer, and the second conductivity type second clad layer to a specified depth and remaining part of the second conductivity type second clad layer;
   sequentially forming a second insulating layer and a photoresist on the whole surface including the first insulating layer, and patterning the photoresist, exposing the second insulating layer on the residual second conductivity type second clad layer;
   performing a wet etching using the patterned photoresist as a mask to etch the second insulating layer and the second conductivity type second clad layer, exposing the etch stop layer and etching the residual photoresist and first and second insulating layers;
   forming a current blocking layer on the exposed etch stop layer, and a second conductivity type contact layer on the whole surface including the current blocking layer; and
   forming electrodes on the second conductivity type contact layer and beneath the substrate, respectively.

5. A method for fabricating a laser diode comprising:
   forming a first cladding layer, an active layer, and a second cladding layer on a substrate to form a first multilayer structure;
   forming an etch stop layer on the first multilayer structure;
   forming a third cladding layer, a semiconductor layer and a contact layer to form a second multilayer structure on the etch stop layer;
   forming a patterned mask on the second multilayer structure and reactive ion etching through the multilayer structure until a portion of the third cladding layer has been etched;
   wet etching a remaining portion of the third cladding layer until the etch stop layer is reached.

6. A method for fabricating a laser diode according to claim 5 wherein the first cladding layer comprises n-AlGaInP.

7. A method for fabricating a laser diode according to claim 5 wherein the second cladding layer comprises p-AlGaInP.

8. A method for fabricating a laser diode according to claim 5 wherein the third cladding layer comprises p-AlGaInP.

9. A method for fabricating a laser diode according to claim 5 wherein the etch stop layer comprises InGaP.

10. A method for fabricating a laser diode according to claim 5 wherein the substrate is GaAs.

11. A method for fabricating a laser diode according to claim 5 further comprising forming a current blocking layer on the portions of the etch stop layer exposed by wet etching and forming a contact layer on the current blocking layer.

* * * * *